United States Patent
Christophersen et al.

(10) Patent No.: US 7,208,069 B2
(45) Date of Patent: Apr. 24, 2007

(54) DEVICE FOR ETCHING SEMICONDUCTORS WITH A LARGE SURFACE AREA

(75) Inventors: Marc Christophersen, Westerville, OH (US); Jörg Bahr, Altenholz (DE); Jürgen Carstensen, Kiel (DE); Kay Steen, Bothell, WA (US); Georgi Popkirov, Kiel (DE); Helmut Föll, Mönkeberg (DE)

(73) Assignee: Kiel University, Kiel (DE)

( * ) Notice: Subject to any disclaimer, the term of this patent is extended or adjusted under 35 U.S.C. 154(b) by 202 days.

(21) Appl. No.: 10/520,761

(22) PCT Filed: Jul. 24, 2003

(86) PCT No.: PCT/DE03/02491

§ 371 (c)(1),
(2), (4) Date: Jun. 10, 2005

(87) PCT Pub. No.: WO2004/017384

PCT Pub. Date: Feb. 26, 2004

(65) Prior Publication Data

US 2005/0239292 A1    Oct. 27, 2005

(30) Foreign Application Priority Data

Jul. 31, 2002    (DE) ................. 102 35 020

(51) Int. Cl.
*C25F 3/12* (2006.01)
*C25F 7/00* (2006.01)
*C25D 17/02* (2006.01)
*C25D 7/12* (2006.01)

(52) U.S. Cl. ............... 204/232; 204/273; 204/275.1; 205/668; 205/672

(58) Field of Classification Search ............. None
See application file for complete search history.

(56) References Cited

U.S. PATENT DOCUMENTS 3,536,600 A * 10/1970 Van Dijk et al. ........... 438/749
3,643,671 A *  2/1972 Henninges et al. .... 156/345.23
5,374,325 A   12/1994 Cannizzaro, Jr.
6,235,147 B1   5/2001 Lee et al.

FOREIGN PATENT DOCUMENTS

EP    0853332 A    7/1998
JP    61255028 A   11/1986

* cited by examiner

*Primary Examiner*—Harry D. Wilkins, III
(74) *Attorney, Agent, or Firm*—Larson & Larson, PA; Herbert W. Larson

(57) ABSTRACT

The device etches semiconductors with a large surface area in a trough-shaped receptacle containing a liquid electrolyte. A sample head is mounted inside the etching trough, and is provided with a device for holding at least one semiconductor wafer. The device is tilted to promote turbulent electrolyte flow in a space between a bottom surface of the semiconductor wafer and top surface of the trough-shaped receptacle.

9 Claims, 4 Drawing Sheets

DEVICE FOR ETCHING SEMICONDUCTORS WITH A LARGE SURFACE AREA

PRIOR APPLICATIONS

This §371 National Phase patent application bases priority on International Application No. PCT/DE2003/002491, filed on Jul. 24, 2003, which in turn bases priority on German Application No. DE 102 35 020.5, filed on Jul. 31, 2002.

BACKGROUND OF THE INVENTION

1. Field of the Invention

The invention relates to a device for etching semiconductor wafers having a large surface area.

2. Description of the Prior Art

It is advantageous or unavoidable for a large number of novel products or working steps in the field of semiconductor technology to use electrochemical etching methods in addition to chemical methods. This more particularly applies to the production of a large variety of pores in e.g. silicon, GaAs, InP or GaP, which can only be produced electrochemically.

Generally for such etching methods, an anodic current is passed through the semiconductor (i.e. the positive pole of the current supply at the semiconductor), which induces at the semiconductor-electrolyte transition a chemical reaction leading to the dissolving of the semiconductor material. The structure to be produced, e.g. so-called macropores with diameters of around 1 μm and depths of a few 100 μm, must be homogeneous over the entire semiconductor surface, and in addition, a simple, reliable and rapid process is highly desired.

Electrochemical (pore) etching in silicon is typically used in technical fields such as:

microelectronics and microsystem, biotechnology, e.g. biochips or biosensors, sensor means in general, production of so-called SOI (Silicon On Insulator) wafers, production of photon crystals, special filters and quantum optics or non-linear optics elements, solar means (e.g. for producing antireflection coatings), fuel cells (as porous electrode), nanotechnology, e.g. in the production of nanowires.

These applications lead to demands which are very difficult to fulfill for large area semiconductor wafers, e.g. silicon wafers with diameters of 300 mm. Even for smaller samples or specimens with surfaces of a few $cm^2$, it is not readily possible to achieve a homogeneous etching. The difficulties arise through the combination of many special circumstances, which with surface areas larger than a few $cm^2$ in all, very rapidly lead to the limits of conventional etching cells. In particular, the following factors are critical and must be respected:

Homogeneous outward and return transport of the electrolyte to the reactive interface. In the case of simple, electrolyte-scavenged cells the flow pattern of the electrolyte always give rise to etching inhomogeneities.

Homogeneous electrical contact with the back of the semiconductor. This contact must be able to bear large currents. With etching current densities of up to about 100 $mA/cm^2$, for typical Si wafers with surface areas of 100 $cm^2$ there are total currents of 10 A and higher, which can lead to electrical and thermal problems.

Possibility of homogeneous illumination of the back surface with high intensity light, which is required for many applications.

Temperature control and monitoring within narrow limits (without influencing the optimized flow behavior).

Absolute tightness of both the wafer mounting and the entire apparatus.

No wafer breaks, also not in the case of samples which have become highly porous through etching and which, therefore, have become mechanically very susceptible to problems.

Resistance of all materials wetted with the electrolyte with respect to extremely aggressive chemicals (e.g. mixtures of HF and organic, high polar solvents).

Safe removal of large amounts of gases which can arise during etching (generally $H^2$ and $O^2$, but in certain cases also the extremely toxic gases $PH^3$ and $AsH^3$).

Usability for all types of semiconductors, e.g. n and p-doped silicon, GaAs, InP, etc.

Known devices for etching n-silicon in aqueous electrolytes already have an illumination of the back surface, the electrolyte flowing over the vertically installed wafer. Electrical back surface contact is made possible by a special $n^+$ implantation of the back surface and contact needles at the wafer edge. This has hitherto made it possible to produce so-called n-macropores (aqu/bsi) with depths of up to 600 μm, but use for other semiconductors, e.g. p-type silicon or InP is not readily possible.

It is also known to use as the back surface contact a second electrolyte, and hydrogen is formed.

Finally, on an industrial scale in the production of SOI substrates, use is made of a device for etching so-called mesopores in silicon. However, etching depths of roughly only 10 μm are required, i.e. the method is much less demanding than the homogeneous etching of macropores with extreme aspect ratios.

SUMMARY OF THE INVENTION

The invention solves the set problem with a device having the features of the main claim and which fulfills all the aforementioned demands. Advantageous embodiments are provided by the subclaims.

In exemplified manner hereinafter for all applications, reference is solely made to use for macropore etching in the semiconductor silicon, preferably p-doped silicon, where the aforementioned requirements are only fulfillable with the greatest difficulty. The transfer to other pores types (e.g. micropores and mesopores) and semiconductors, particularly from the group of III–V compounds is then fundamentally possible, whilst requiring minor modifications forming part of the prior art (e.g. use of other electrolytes or other sample geometries). The application to non-semiconductors is also possible.

The device according to the invention makes it possible to also carry out a galvanic deposition (coating). Apart from fulfilling the aforementioned requirements, the specific advantages of the invention more particularly consist of the following points:

(1) Resistance to electrolytes which, apart from the hydrofluoric acid (HF) always required for SI-etching, also contain aggressive, organic solvents such as e.g. acetonitrile, dimethyl formamide, formamide, dimethyl sulphoxide, hexamethyl phosphoric triamide or dimethyl acetamide. These chemicals not only attack most standard plastics, but also auxiliary materials such as plasticizers in plastics, adhesives, hoses or O-rings.

(2) Homogeneous etching or flow patterns for the numerous different types of electrolytes with e.g. different viscosities.

(3) Easy adaptation of the sample holder to samples of the most varied sizes and geometries, without any homogeneity loss.

(4) Variability in connection with back surface contacting, illumination of the back surface as an option.

(5) In situ monitoring of all etching parameters.

The novel device carries this out by in particular implementing the following points:

(i) Complete separation of etching trough and "sample head".

(ii) Possibility for operation with the side to be etched downwards (normal case).

(iii) Production of homogeneous etching conditions by on time average-homogeneous electrolyte flow, brought about by easily controllable tilting movements of sample head and etching trough.

(iv) Production of the sample head and etching trough from on each case a piece of suitable material (e.g. PTFE; trade name usually Teflon®) which ensures an absolute outflow protection.

(v) Contacting the back surface, as desired, by marginal contacts, whole-area metal contacts (particularly usable with samples having a metallized back), a glass plate coated with ITO (Indium Tin Oxide, a transparent conductor) or a Plexiglas® plate around which are wound thin platinum wires in order to permit back surface illumination.

(vi) Monitoring the electrolyte quality (with the parameters temperature, gases in solution, concentrations of the components) and etching parameters (voltage, current, illumination level, but also e.g. the impedance), processing by suitable software and corresponding "real time" control.

BRIEF DESCRIPTION OF THE DRAWINGS

Further advantages and features of the present invention can be gathered from the following description of the preferred embodiment relative to the attached drawings, wherein.

DETAILED DESCRIPTION OF THE PREFERRED EMBODIMENT

Figure 1:
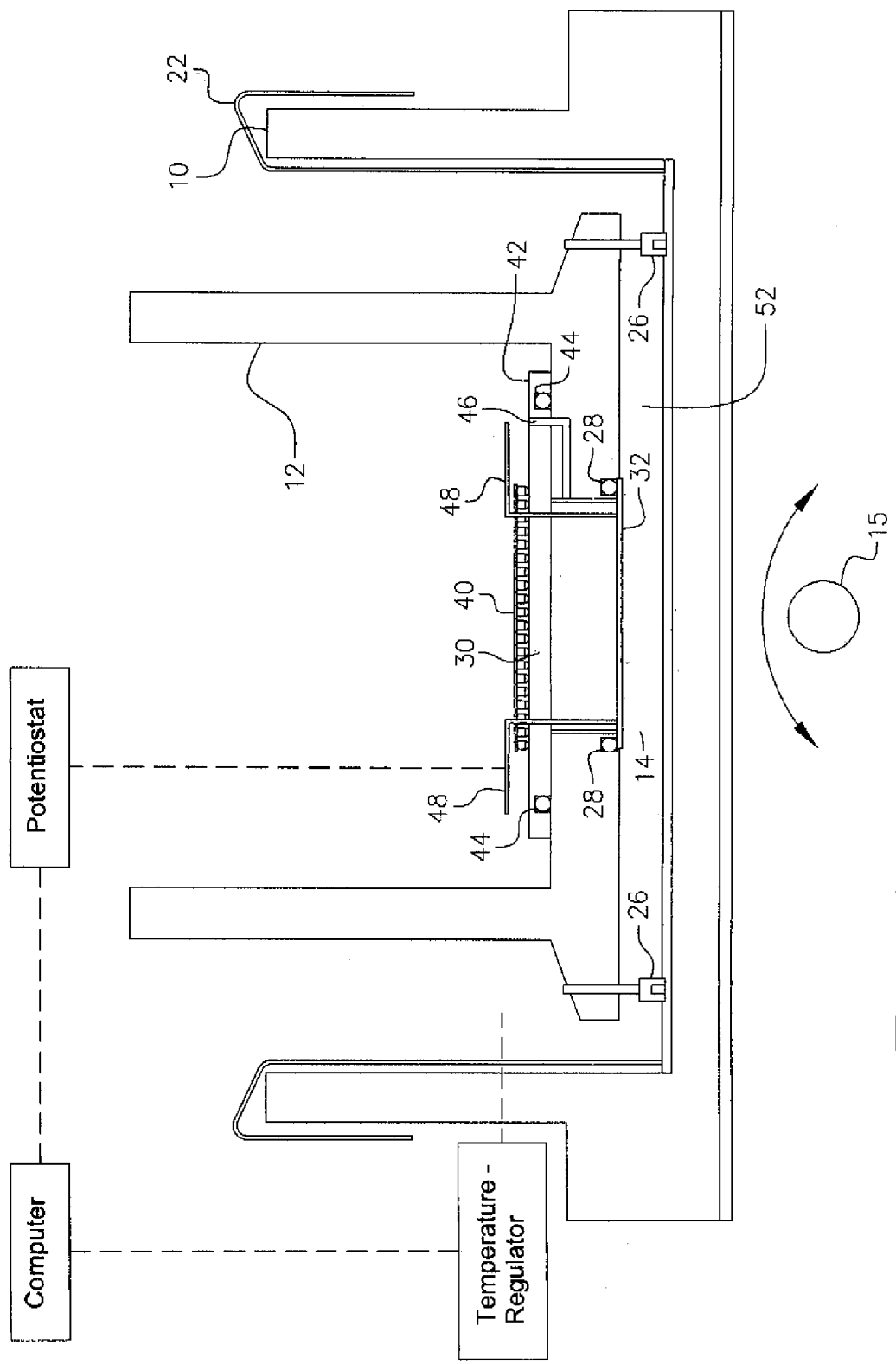
FIG. 1 shows a diagrammatic representation of the structure of the device for etching semiconductor wafers with a large surface area.

The device for etching semiconductor wafers with a large surface area employs a trough-shaped etching receptacle 10 with a liquid electrolyte 14, at least one sample head 12 provided within the movably mounted etching trough 10 and with a device for holding at least one semiconductor wafer.

The sample head 12 is fixed to the etching trough 10, which can be pivoted 15 about at least one axis for performing tilting movements. A tilting movement can be rendered unnecessary if the head 12 can be moved backwards and forwards horizontally in the trough 10, so that there is a similar electrolyte flow to that resulting from the tilting movement. To improve the turbulent electrolyte flow, it is proposed that ducts 24 are provided on the bottom of the etching trough 10 and/or on the underside of the sample head 12.

However, preferably, the sample head 12 is mounted on and so as to move with the tiltable etching trough 10 by means of replaceable spacers 26 and for setting different electrolyte coating thicknesses on the semiconductor wafer 32 with the side to be etched downwards on the underside of the sample head 12 above the underlying base of the etching trough 10.

For the mounting of the in part extremely fragile semiconductor wafers 32 while permitting a back surface illumination, it is proposed that on the sample head 12 a replaceable assembly or mounting block 30 is positioned above the semiconductor wafer 32 and which is provided with marginal gaps 38, which can be evacuated by means of a vacuum line 46 and which are sealed with respect to the electrolyte by ring seals 28 on the marginal area of the semiconductor wafer 32. To permit an illumination of the semiconductor wafer 32, the assembly block 30 is preferably optically transparent and a diode array 40 is provided for illumination purposes on its top surface above a transparent plate 42 sealed against the vacuum surrounding the assembly block 30.

In order to avoid leak-susceptible passages, it is proposed that contacting takes place with a large area platinum electrode on the bottom of the etching trough 10, which is contacted with platinum wires 48, which rise up the inside of the etching trough 10 and over the edge thereof. The (top) back surface of the semiconductor wafer is contacted by means of marginal contacts, whole-area metal contacts a glass plate 42 coated with ITO or Plexiglas® (methylacrylate) plate around which is wound thin platinum wires 48.

At least one temperature control for heating and/or cooling the electrolyte can be provided with cooling/heating ducts on the underside of the etching trough. In addition, for forming an inert gas atmosphere over the electrolyte the etching trough or etching head can be provided with a cover and with feeds and drains for inert gas.

During the production of a turbulent flow for the varyingly viscous electrolytes, it is proposed that there is an etching trough 10 movement adapted to the semiconductor wafers 32 to be etched, and a setting of the spacing 52 between the semiconductor wafer 32 and the etching trough 10 bottom by means of the prior insertion between the same of suitable spacers 26.

For making good the acids consumed in the electrolyte, advantageously during the advancing etching highly concentrated electrolyte is added to maintain electrolyte concentration.

FIG. 1 shows the basic components, namely the etching trough 10 and sample head 12, and between which is introduced the electrolyte 14. The complete arrangement is installed on a holder 15 rotatable about a horizontal axis. In operation there is a rocking movement with a total angle of 5°–25° and a tilting frequency of approximately 0.25 Hz (generally between 0 and 2 Hz), so that there is a very effective electrolyte circulation and homogeneous etching of even large surfaces can be very easily carried out.

Thus, no pump is required for operation for electrolyte circulation with a correspondingly high pumping capacity. This also obviates the need for connecting pieces, valves, hoses, etc., which are exposed to considerable mechanical loads and aggressive electrolytes. In addition, virtually all pumps produce pressure surges, which can lead to a temporarily inhomogeneous pressure reduces and absorbers. When using a pump the electrolyte 14 must be fanned out from the pump connecting pieces to the wafer 32 by suitable guidance and this is rendered unnecessary by the present design. There is also a significant increase in the operational reliability of the device, because the electrolyte only "sees" Teflon. Leaks as a result of porosities, breaks, etc., which can cause potentially major risks with the often extremely corrosive, flammable and toxic electrolytes are fundamentally impossible.

The temperature of the electrolyte 14 is kept constant, can be set to 0.1° C., and can be varied in planned manner during etching. The geometries of the etching trough 10 and sample head 12 are described hereinafter.

Figure 2:
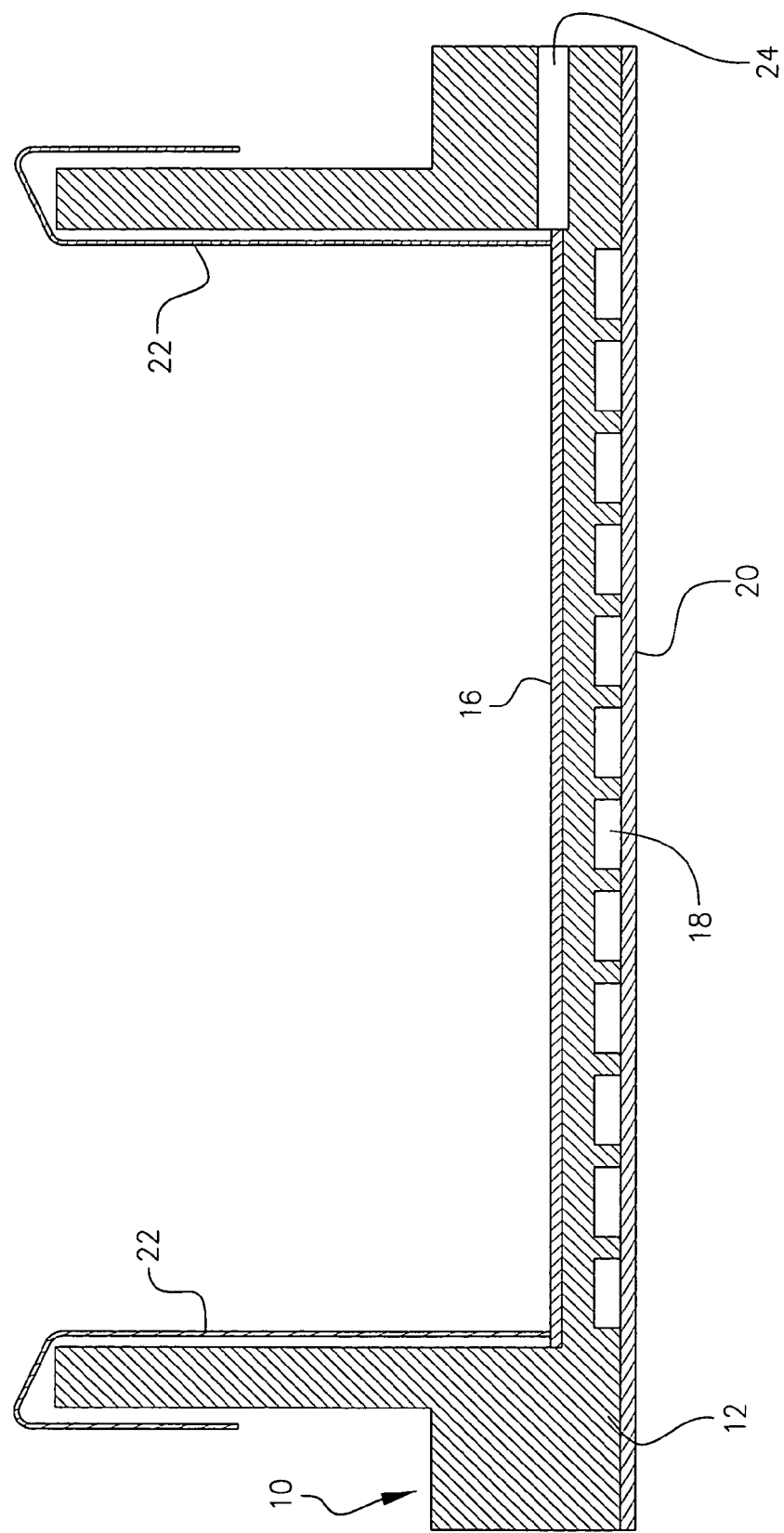
FIG. 2 shows the etching trough.

FIG. 2 shows an etching trough 10 made from a Teflon block. Even in the case of aggressive electrolytes, it ensures outflow tightness and durability. A preferably platinum, large area counterelectrode 16 is installed on the bottom of the etching trough 10. The underside of the trough 10 is provided with milled-in ducts 18 which, after closure with e.g. an aluminum plate 20, permit a thermostatting of the electrolyte 14 by a circulating thermostatting liquid. Platinum wire connections or terminals 22 for the platinum counterelectrode 16 are passed over the edge, which avoids holes and seals. Reference numeral 24 designates an electrolyte liquid inflow and outflow.

Figure 3:
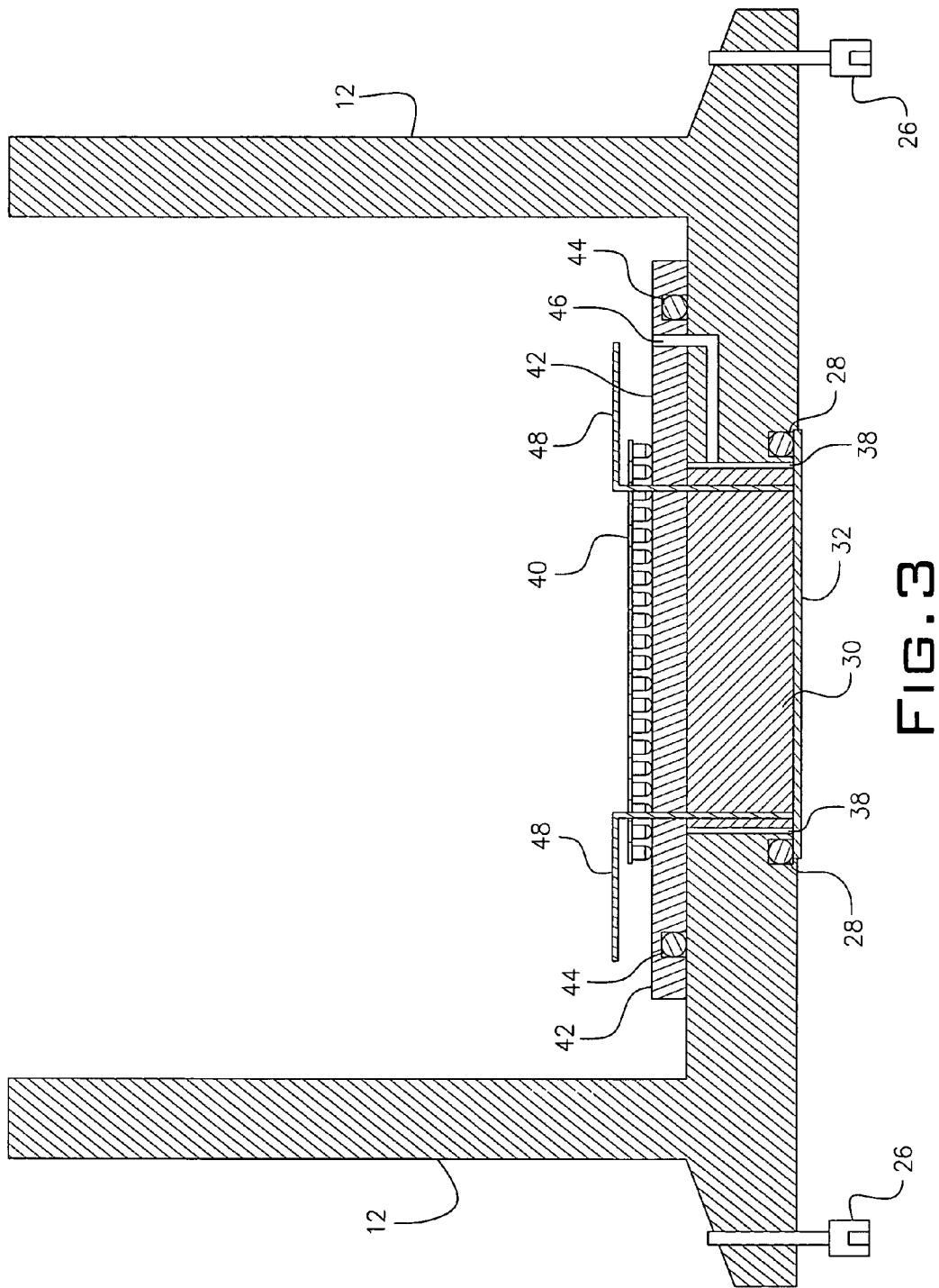
FIG. 3 shows the sample head with the sample chamber.
Figure 4:
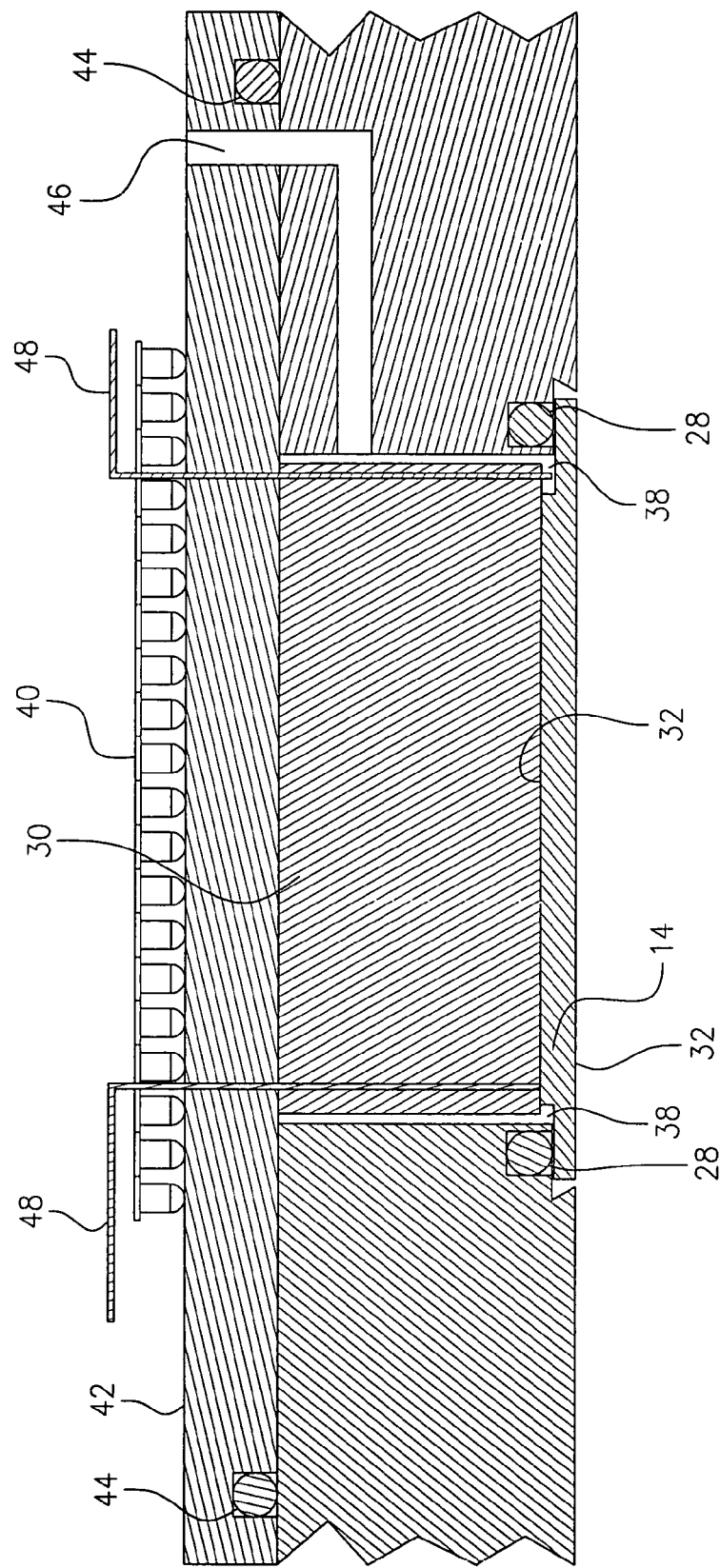
FIG. 4 shows a detailed view of the illumination of the sample back surface of the device of the present invention.

The sample head 12, shown in FIGS. 3 and 4 as the heart of the device, is now introduced into the etching trough 10 with the surface to be etched downwards. The spacing 52 between the etching trough 10 bottom and sample head 12 can be very easily varied by spacers 26. This arrangement together with the rocking movement of the entire device ensures the maintenance of the decisive (particularly flow) parameters during etching.

The sample head 12 is also made from a Teflon block, so that even with the most aggressive electrolytes it ensures tightness and durability.

The wafer 32 is sealed by means of two sealing rings 28, which engage on its back surface, the sample head 12 being provided with an all-round notch for housing the sealing rings 28 alongside a sample chamber 30. The contact pressure necessary for retaining the wafer 32 can be produced by evacuating the sample chamber 30 with a not shown vacuum system at connection 38.

As here, e.g. in the case of a sample break, electrolytes can be sucked into the vacuum system, the latter as a precaution contains an electrolyte-resistant collecting container.

Temperature sensors and reference electrodes (not shown) are fitted as close as possible to the wafer 32 in order to obtain reliable control values.

Electrical contacting of the wafer 32 takes place in large area form via the back surface, various options being possible:

(i) Contacting the sample 12 (generally, but not necessarily, a circular wafer) by a suitable metal plate or foil, e.g. aluminum, using an e.g. PVC assembly block with the aid of the vacuum in the sample chamber 30. External connection takes place by means of one or more wires, which are led outwards from the edge of the metal plate. This contacting is suitable for all samples having a good conducting back surface and requiring no back surface illumination.

(ii) Contacting of the sample 12 in such a way that illumination of the back surface is possible. For this purpose the metal plate and an assembly block are replaced either by an indium-tin oxide (ITO)-coated glass plate or a contact plate 42, around which is wound thin platinum wires 48, made from transparent plastic (e.g. Plexiglas®, PMMA) or glass. Winding takes place in such a way that the transparency is not significantly impeded. Intense, homogeneous illumination is made possible by a light emitting diode array 40 via the now transparent stop plate 42.

It is alternatively possible to have a contacting of only the edge of the sample 12 using contact needles. However, this is generally disadvantageous, because it is then more difficult to achieve current flow homogeneity.

The device completed by the following means:

An efficient potentiostat and/or galvanostat able to supply the necessary relatively high voltages and currents and which can be controlled from the central computer.

A pumping unit with a sufficiently high throughput (approx. 30 l/min) for vacuum suction.

A wolf bottle (made from electrolyte-resistant material) integrated into the vacuum system, so that the aggressive electrolytes, even in the case of a wafer break cannot enter the vacuum pump or environment.

A temperature unit which, by means of a heat exchanger, makes it possible to keep the electrolyte temperature constant to within +/−0.2° C. in the case of a predetermined temperature range of approx. −10° C. to +40° C. The unit must also be controllable from the central computer.

A unit 15 for performing the rocking movement, namely either a conventional rocking table or a simple hydraulic/mechanical/pneumatic device.

A computer controlling the device.

Corresponding software.

An optional, computer-controllable light source for illuminating the back of the sample. This light source is preferably, but not necessarily constituted by a light emitting diode array 40.

Transparent contact plates 42 made from glass coated with ITO or transparent material around which thin PT wires are wound.

A system of holes integrated into the cell head by means of which inert gases can be introduced into the electrolyte (e.g. for nitrogen bubbling in order to expel dissolved oxygen).

What is decisive for homogeneous etching over large surface areas is the homogeneity of the current supply and electrolyte flow. Homogeneity of the current supply is ensured by the contacting methods described, but the time-average, electrolyte flow homogeneity is more difficult to bring about.

Unlike in known etching methods, in which the electrolyte flow homogeneity can only be ensured for a fixed set of parameters (particularly a fixed sample size) and only using protracted iterative optimization, the device according to the invention can easily be adapted to the most varied conditions. For optimizing the flow conditions for a given set of parameters (e.g. temperature-dependent electrolyte viscosity, size of the wafer to be etched (typically between 50 and 300 mm diameter) and conductivity of the electrolyte), the tilting angle, tilting frequency and sample head-etching trough 10 bottom spacing 52 can be appropriately modified and the flow homogeneity can be directly monitored by observation.

This takes place in that in place of the actual sample 12 a transparent wafer 32 is fitted (using a transparent assembly block) and with the electrolyte 14 is admixed a small amount of suspended particles (e.g. conductive silver). The flow conditions are then clearly visible and can be very rapidly optimized to the intended use. For the etching of p-type silicon wafers 32 with a specific resistance of 0.001 to 50

Ωcm and with a diameter of 100 mm, tilting angles of 6 to 25°, tilting frequencies of 0.05 to 2 Hz and an electrolyte volume of 1 to 3 liters are appropriate.

The optimal etching temperature is important and must be adjusted as a function of the material and the desired pore type. A constant temperature of +/−0.1° C. is necessary for many etching processes and can be achieved according to the present invention. For particularly, demanding etching operations, e.g. macropores in p-silicon and having depths of >100 μm, it may be necessary to modify in planned manner the temperature of 10 μm in which macropores with depths of 200 μm are to be etched, it is e.g. advantageous to have a continuous temperature change from 20 to 12° C.

For most applications it is advantageous to etch with a constant current. The potentiostat/galvanostat must then be in a position to supply the necessary voltage, which can easily reach around 100 V.

The desired parameters and optionally their time changes are programmed in the computer, and then the etching process can begin.

The semiconductor wafer 32 to be etched appropriately has a low-ohmic back surface contact, which in conventional technology is brought about by the implantation of a $p^+$ coating in the p-type semiconductor or a $n^+$ coating in the n-type semiconductor, followed by the conventional thermostatting and metallizing steps, a non-transparent metallization only being required with sample not needing a back surface illumination, but at least the areas to be etched must be recessed.

It is advantageous to clean the front of the sample 12, and numerous cleaning methods are described in the literature.

Contacting the back of wafer 32 takes place in the aforementioned manner. Generally, it is most appropriate to use thin metal foils which are pressed onto the sample 12 by means of the assembly block 30 made from relatively soft plastic. Thick metal plates must be very well polished in order to obtain homogeneous contacting.

The assembly block 30 thickness is of decisive importance. It must be precisely set in such a way that on the one hand a certain sample sagging is possible in order to bring about adequate contact pressure for tightness, but the sag must be limited in such a way that sample breaking is prevented even in the porous state. The necessary numerical values are dependent on the sample type and size, but can be easily established.

When using n-type semiconductors with a significant diffusion length (generally Si and Ge) for which back surface illumination is appropriate, in the manner described hereinbefore, contacting modification takes place. Onto the back of the semiconductor sample is firmly pressed a glass plate 42, e.g. coated with ITO, and the ITO coating is contacted on the edge. A light emitting diode array 40 is placed over the arrangement and has a spectral radiation distribution adapted to the semiconductor, i.e. with a frequency maximum slightly below the absorption edge of the semiconductor. Thus, the back of the semiconductor wafer 32 can at least be locally illuminated.

The lighting efficiency of the light emitting diode array 40 is now preferably adapted to set a constant current density.

The semiconductor wafers 32 can also be structured on the front, i.e. have a masking coating resistant to the electrolyte used. The etching action is then limited to the open areas. The total current must be adapted in such a way that the current density in the unprotected areas reaches the desired value.

After basic setting and programming of the device and fitting of the sample 12, etching is commenced. The entire process now takes place automatically and typical etching times are between 10 minutes and 24 hours.

In summary, the method can be described as follows. For etching large area semiconductor wafers 32, the electrolyte 14 is brought into movement by a rocking mechanism 15 in a trough-shaped receptacle with a liquid electrolyte 14 with at least one sample head 12 within a movably mounted etching trough 10 and which is equipped with a device for holding at least one semiconductor wafer 32. The sample head 12 with the surface to be etched (front) is placed downwards in the etching trough 10, and for setting different electrolyte coating thicknesses replaceable spacers 26 are provided for the etching trough 10 bottom-sample head spacing, and on the back surface are provided electrical contacts for an electrochemical etching process.

Advantageously, the sample head 12 is firmly fixed to the trough 10. For performing tilting movements, the etching trough 10 is pivotable about at least one axis and/or further ducts are provided on the bottom of the etching trough 10 and/or on the underside of the sample head 12 for the turbulent circulation of the electrolyte 14.

On sample head 12 a replaceable assembly block 30 can be positioned above the semiconductor wafer 32 and is provided with marginal gaps evacuatable by means of a vacuum line 38, and which are sealed by ring seals 28 on the marginal area of the semiconductor wafer 32 with respect to the electrolyte 14.

A preferably used platinum counterelectrode 16 on the bottom of the etching trough 10, with platinum wires 48 rising over the edge of the inside of the etching trough 10, is contacted and the semiconductor wafer 32 undergoes contacting at its (top) back surface, by means of marginally contacting whole-area metal contacts, a glass plate 42 coated with ITO or a Plexiglas® plate around which is wound fine or thing platinum wires 48 in the manner described hereinbefore.

Preferably, there should be at least one temperature control for heating and/or cooling the electrolyte 14 with cooling/heating ducts on the underside of the etching trough 10. For forming an overpressure atmosphere on the etching trough 10, should be provided a cover positioned above the electrolyte 14 and equipped with feeds and drains for insert gas.

In the etching trough 10, an electrolyte-wetted location can be provided for the provision of drying agents, which remove traces of water from the electrolyte 14. If the assembly block 30 is optically transparent, it is possible to place on its tip a diode array 40 for illumination purposes above a transparent plate 42 sealing against the vacuum surrounding the assembly block 30. This makes it possible to produce a turbulent flow of varyingly viscous electrolytes to the semiconductor wafer 32 to be etched by an adapted movement of the etching trough 10, and setting the spacing of the semiconductor wafer 32 with respect to the trough 10 bottom through the prior introduction between the same of suitable spacers 26.

During etching, there is preferably a progressive addition of highly concentrated electrolytes for maintaining the electrolyte concentration, and the electrolyte can be mixed with added drying agents.

The back surface can be illuminated in alternative manner with a laser beam scanning over the illumination surface.

The following TABLE 1 gives exemplified parameter sets for some of the possible pore etching processes.

TABLE 1

TYPICAL PARAMETER SETS

| Material: | p-silizium | | n-Si | n+-Si | n-GaAs | n-InP | | |
|---|---|---|---|---|---|---|---|---|
| Pore Type: | Macro | Micro | Trench | Macro | Macro | Crysto | Cyrsto | Curro |
| Electrolyte: | org | aqu/fa | org | aqu M-org | aqu/ HMPA | aqu | aqu | aqu |
| Temp: | 20° C. | 20° C. | 20° C. | 14° C. | 20° C. | 20° C. | 20° C. | 20° C. |
| j [A/cm$^2$]: | 0.002 | 0.025 | 0.0005 | 0.002–0.03 | 0.002–0.008 | <0.9 | <0.1 | 0.1.1 |
| U [V]: | 2–16 | 20–40 | 1–2 | 1–4 | 1–2 | 20–90 | 20–60 | 30–90 |
| Illumination: | no | no | no | yes | no | no | no | no |
| Tilting Frequency: | 0.3 Hz | 0.2 Hz | | 0.3 Hz | 0.2 Hz | 0.8 Hz | 0.3 Hz | 0.8 Hz |
| Tilting Angle: | 8° | 8° | 8° | 8° | 5° | 4° | 8° | 3° |
| Slit: | 10 mm | 8–11 mm | 8 mm | 10 mm | 8–10 mm | 6 mm | 8 mm | 5 mm |

Table 1:
Abbreviations:
Macro, meso, micro = macro, meso, micropores according to IUTPC
Crysto, curro = "crystallographically" or "current-line oriented pores"
j = current density
U = voltage
Electrolytes:
org = organic electrolyte;
Aqu = aqueous electrolyte

Having thus described the invention, what is claimed and desired to be secured by Letters Patent is:

1. A device for etching large surface area semiconductor wafers in an etching trough containing a liquid electrolyte, the device comprising:
   a) at least one sample head mounted within the etching trough;
   b) means within the sample head for holding the semiconductor wafer with an etching surface facing downwards;
   c) means without the use of pumps for causing movement of the electrolyte mounted below the etching trough;
   d) at least two replaceable spacers mounted on opposite end portions of the sample head to maintain a designated space between the etching surface and the etching trough; and
   e) electrical contacts mounted on the sample head for electrochemical etching.

2. The device according to claim 1, wherein the sample head is movably mounted within the etching trough.

3. The device for etching according to claim 1, wherein the sample head is firmly fixed within the etching trough, and the etching trough is pivotable about an axis for providing tilting movements.

4. The device for etching according to claim 1, wherein a first duct passes through a bottom of the etching trough, and a second duct passes through a lower portion of the sample head to promote turbulent circulation of the electrolyte.

5. The device for etching according to claim 1, wherein a replaceable assembly block is positioned above the semiconductor wafer within the sample head, a marginal gap on each side of the assembly block evacuatable by means of a vacuum line, and is sealed with respect to the electrolyte by ring seals on a marginal area of the semiconductor wafer.

6. The device for etching according to claim 1, wherein a platinum counterelectrode on a bottom portion of the etching trough is electrically contacted with platinum wires rising up from the inside of the etching trough and passing over the top edge thereof.

7. The device for etching according to claim 1, wherein a top surface of the semiconductor wafer is in electrical contact with an indium-tin oxide coated glass plate around which is wound a thin platinum wire.

8. The device for etching according to claim 1, wherein a top surface of the semiconductor wafer is in electrical contact with a methylacrylate plate around which is wound a thin platinum wire.

9. The device for etching according to claim 5, wherein the assembly block is optically transparent, and a diode array and a transparent plate are mounted on a top surface of the assembly block, the plate sealing against a vacuum surrounding the assembly block.

* * * * *